US008723172B2

(12) United States Patent
Shu et al.

(10) Patent No.: US 8,723,172 B2
(45) Date of Patent: May 13, 2014

(54) DISPLAY DEVICE, THIN FILM TRANSISTOR ARRAY SUBSTRATE AND THIN FILM TRANSISTOR HAVING OXIDE SEMICONDUCTOR

(75) Inventors: Fang-An Shu, Hsinchu (TW); Lee-Tyng Chen, Hsinchu (TW); Henry Wang, Hsinchu (TW); Wei-Chou Lan, Hsinchu (TW); Tung-Liang Lin, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 167 days.

(21) Appl. No.: 12/699,058

(22) Filed: Feb. 3, 2010

(65) Prior Publication Data
US 2011/0095285 A1 Apr. 28, 2011

(30) Foreign Application Priority Data
Oct. 26, 2009 (TW) ................................ 98136173 A (51) Int. Cl.
*H01L 29/10* (2006.01)
*H01L 29/12* (2006.01)
*H01L 29/04* (2006.01)
*H01L 31/00* (2006.01)
*H01L 21/00* (2006.01)
*H01L 21/16* (2006.01)

(52) U.S. Cl.
USPC .......... 257/43; 257/57; 257/59; 257/E29.296; 257/E29.068; 257/E33.053; 438/104

(58) Field of Classification Search
USPC ........... 257/43, 57, 59, E29, 68, 296, E33, 53
See application file for complete search history.

(56) References Cited

U.S. PATENT DOCUMENTS

| 2004/0053431 A1* | 3/2004 | Chang et al. ..................... 438/30 |
| 2006/0049403 A1* | 3/2006 | Byun et al. ....................... 257/59 |
| 2006/0109407 A1* | 5/2006 | Kim ............................... 349/134 |
| 2006/0284171 A1* | 12/2006 | Levy et al. ....................... 257/43 |
| 2007/0108446 A1* | 5/2007 | Akimoto ......................... 257/61 |
| 2007/0166859 A1 | 7/2007 | Lee et al. |
| 2009/0230390 A1* | 9/2009 | Gosain et al. .................... 257/43 |

(Continued)

OTHER PUBLICATIONS

Definition of Complete. Merriam-Webster Dictionary Online (2013). Retrieved Jan. 11, 2013 from http://www.merriam-webster.com/dictionary/complete.*

(Continued)

*Primary Examiner* — Michael Jung
(74) *Attorney, Agent, or Firm* — Chun-Ming Shih (57) ABSTRACT

A display device including a thin film transistor array substrate, transparent electrode substrate and a display medium layer disposed therebetween is provided. The thin film transistor array substrate includes a plurality of thin film transistors with an oxide semiconductor layer respectively. In each thin film transistor, a gate electrode and a gate insulating layer are disposed on a substrate sequentially and the gate electrode is covered by the gate insulating layer. The oxide semiconductor layer is conformably covering on the gate insulating layer and has a channel region located above the gate electrode. A source electrode and a drain electrode of each thin film transistor are disposed on the oxide semiconductor layer and at one side of the channel region respectively. Since the oxide semiconductor layer is made of transparent material, the patterning process of the oxide semiconductor layer can be omitted during the manufacturing process of the reflective display device. Thus, the cost and time-consumed of manufacturing process of the reflective display device can be reduced.

23 Claims, 5 Drawing Sheets

(56) References Cited

U.S. PATENT DOCUMENTS

2009/0315026 A1* 12/2009 Jeong et al. ............. 257/43
2010/0025675 A1* 2/2010 Yamazaki et al. ........ 257/43
2010/0044711 A1* 2/2010 Imai ........................ 257/59
2010/0084649 A1* 4/2010 Seo et al. ................. 257/43
2010/0117075 A1* 5/2010 Akimoto et al. ......... 257/43
2010/0148169 A1* 6/2010 Kim et al. ................ 257/43
2011/0122344 A1* 5/2011 Matsumuro et al. ...... 349/96

OTHER PUBLICATIONS

China Official Action issued on Dec. 5, 2012.

* cited by examiner

DISPLAY DEVICE, THIN FILM TRANSISTOR ARRAY SUBSTRATE AND THIN FILM TRANSISTOR HAVING OXIDE SEMICONDUCTOR

This application claims priority to a Taiwan application No. 098136173 filed Oct. 26, 2009.

BACKGROUND

1. Field of the Present Invention

The present invention relates to a display device, and particularly to a display device and a thin film transistor array substrate and a thin film transistor thereof with low current leakage.

2. Description of the Related Art

Reflective display device shows images by using the reflected incident light as light source. Since the back light source is unnecessary for the reflective display device, the power-consumption and the size of the reflective display device can be reduced. Therefore, the reflective display device is taken highly attention in recently display device markets.

Further, the display devices of nowadays mostly can be grouped into active display devices and passive display devices according to driving elements thereof. Usually, active display devices use thin film transistors as driving elements. Moreover, since amorphous silicon thin film transistor (a-Si TFT) has the advantages of low cost and simple production, mostly active display devices use amorphous silicon thin film transistors as driving elements.

Figure 1:
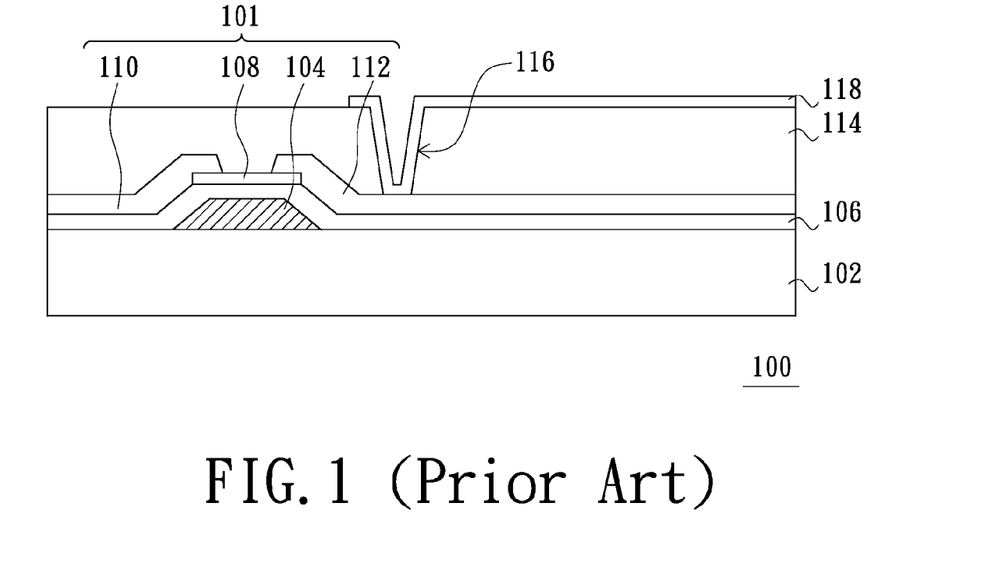
FIG. 1 is a schematic cross-section view of thin film transistor array substrate in single pixel of the conventional active display device.

FIG. 1 is a schematic cross-section view of thin film transistor array substrate in single pixel of the conventional active display device. Referring to FIG. 1, a gate electrode 104 is formed on the substrate 102 firstly during the process of the thin film transistor array substrate 100. Next, a gate insulating layer 106 is formed to cover the gate electrode 104. Then, an amorphous silicon layer (not shown in FIG. 1) is formed on the gate insulating layer 106. Since the amorphous silicon layer is opaque, the amorphous silicon layer is then removed except the portion located above the gate electrode 104 for increasing aperture ratio of the pixel. Therefore, the non-removed portion of the amorphous silicon layer is regarded as a channel layer 108.

Then, a source electrode 110 and a drain electrode 112 are formed on the gate insulating layer 106 to cover a portion of the channel layer 108. At this time, the manufacturing process of a thin film transistor 101 is substantially finished. Next, a protective layer 114 with opening 116 is formed on the substrate 102. A portion of the drain electrode 112 is exposed by the opening 116. Then, a pixel electrode 118 is formed on the protective layer 114 and filled into the opening 116. Thus, the pixel electrode 118 is electrically connected to the drain electrode 112.

However, since the amorphous silicon materials have optical-electric properties, if the thin film transistors array 100 is used in reflective display device, when the light emitted from environment illuminates the channel layer 108, current leakage is generated in the channel layer 108, so that the action of the thin film transistor may be unusual and resulted in abnormal display of the display device.

A conventional method is provided for preventing the light emitted from environment from illuminating the channel layer 108 by forming a metal light-shielding layer (not shown in FIG. 1) on the channel layer 108. Thus, the current leakage may be prevented from being generated. However, forming the metal light-shielding layer may increase the cost of the reflective display device.

BRIEF SUMMARY

Therefore, the present invention is directed to a thin film transistor having a channel layer without optical-electric properties, thus the current leakage can be prevented from being generated as the channel layer is illuminated.

The present invention is also directed to a thin film transistor array substrate manufactured by low cost and has thin film transistors without current leakage as illuminated.

The present invention is further directed to a display device having thin film transistors without current leakage as illuminated. Therefore, the display efficacy of the display device can be improved.

The present invention provides a thin film transistor including a gate electrode, a gate insulating layer, a source electrode, a drain electrode and an oxide semiconductor layer. The gate electrode and the gate insulating layer are disposed on the first substrate and the gate electrode is covered by the gate insulating layer. The oxide semiconductor layer is conformably disposed above the gate insulating layer and has a channel region located above the gate electrode. The source electrode and the drain electrode are respectively disposed above the gate insulating layer and located at the sides of the channel region of the oxide semiconductor layer.

The present invention also provides a thin film transistor array substrate including a first substrate, a plurality of data lines, a plurality of scan lines, a plurality of the aforementioned thin film transistors, a protective layer and a plurality of pixel electrodes. The scan lines intersect the data lines to define a plurality of pixel regions on the first substrate. Each thin film transistor is correspondingly disposed within one of the pixel regions and electrically connected to one of the data lines and one of the scan lines correspondingly. The protective layer covers the first substrate and has a plurality of contact holes respectively exposing a portion of the drain electrodes of the thin film transistors. The pixel electrodes are respectively disposed within one of the pixel regions. Further, the pixel electrodes are respectively filled into the contact holes and electrically connected to the drain electrodes correspondingly.

The present invention further provides a display device including the aforementioned thin film transistor array substrate, a transparent electrode substrate and a display medium layer disposed therebetween.

In one embodiment of the present invention, the oxide semiconductor layer is conformably disposed on the gate insulating layer. Moreover, the source electrode and the drain electrode are disposed on the oxide semiconductor layer.

In one embodiment of the present invention, the oxide semiconductor layer is conformably disposed on the source electrode and the drain electrode. Moreover, the channel region is disposed between the source electrode and the drain electrode.

In one embodiment of the present invention, materials of the source electrode and the drain electrode may be metal materials or transparent conductive materials.

In one embodiment of the present invention, the thin film transistor further includes a first ohmic contact layer and a second ohmic contact layer. The first ohmic contact layer is disposed between the source electrode and the oxide semiconductor layer. The second ohmic contact layer is disposed between the drain electrode and the oxide semiconductor layer.

In one embodiment of the present invention, materials of the oxide semiconductor layer may be indium gallium zinc oxide (IGZO) or indium zinc oxide (IZO).

In one embodiment of the present invention, materials of the gate electrode may be metal materials or transparent conductive materials.

In one embodiment of the present invention, materials of the gate electrode may be metal materials or transparent conductive materials. For example, materials of the gate electrode may be polyimide, polyethylene terephthalate, polyethylene naphthalate or polymethacrylate.

In one embodiment of the present invention, materials of the protective layer may be silica or resin.

In one embodiment of the present invention, the display medium layer may be microcapsule electrophoretic layer, microcup electrophoretic layer, cholesteric liquid crystal layer, electro-wetting layer or quick response-liquid powder layer.

In one embodiment of the present invention, the transparent electrode substrate further includes a color filter film disposed on the second substrate and located between the transparent electrode and the second substrate.

In the present invention, since the channel layer of the thin film transistor of the display device is made of oxide semiconductor materials without optical-electric properties, the thin film transistor can avoid from generating current leakage while being illuminated. Additionally, since the oxide semiconductor layer is made of transparent material, the patterning process of the oxide semiconductor layer can be omitted during the manufacturing process of the display device of the present invention. Therefore, the cost and time-consumed both can be reduced.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 2:
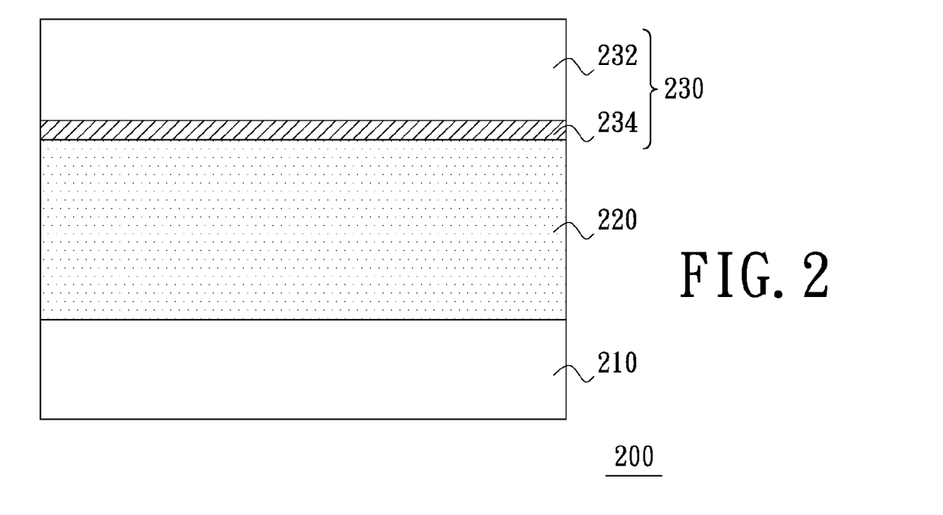
FIG. 2 is a schematic cross-section view of a display device in accordance with an embodiment of the present invention.

FIG. 2 is a schematic cross-section view of a display device in accordance with an embodiment of the present invention. Referring to FIG. 2, the display device 200 includes a thin film transistor array substrate 210, a display medium layer 220 and a transparent electrode substrate 230. The transparent electrode substrate 230 is disposed above the thin film transistor array substrate 210 and the display medium layer 220 is disposed between the transparent electrode substrate 230 and the thin film transistor array substrate 210.

The transparent electrode substrate 230 includes a second substrate 232 and a transparent electrode 234. The transparent electrode 234 is disposed on the second substrate 232 and located between the second substrate 232 and the display medium layer 220. Furthermore, the second substrate 232 may be made of glass or plastic. In this embodiment, the second substrate 232 is made of polyimide, polyethylene terephthalate, polyethylene naphthalate or polymethacrylate.

The display medium layer 220 may be microcapsule electrophoretic layer, microcup electrophoretic layer, cholesteric liquid crystal layer, electro-wetting layer or quick response-liquid powder layer, but the invention is not limited thereto.

Figure 3:
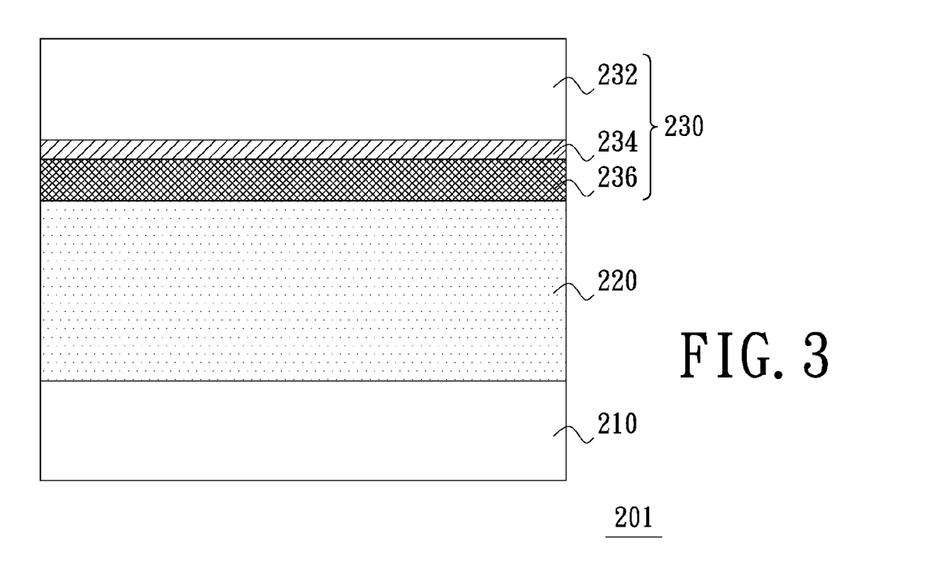
FIG. 3 is a schematic cross-section view of a display device in accordance with another embodiment of the present invention.

Especially, in another embodiment of the present invention, the transparent electrode substrate 230 may further include a color filter film 236 disposed between the transparent electrode 234 and the second substrate 232, as shown in FIG. 3. That is, the display device 201 illustrated in FIG. 3 is a colorful display device.

Figure 4:
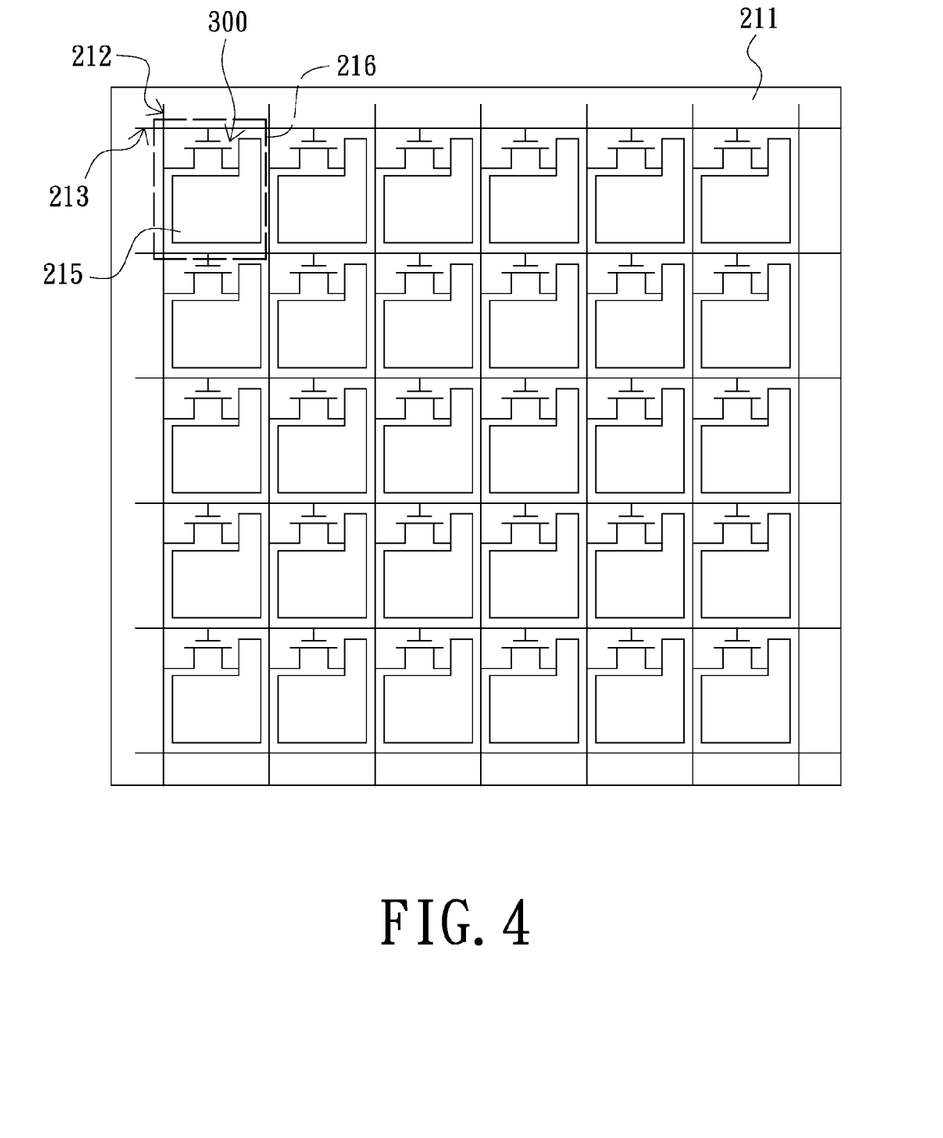
FIG. 4 is a schematic view of a thin film transistor array substrate in accordance with an embodiment of the present invention.

FIG. 4 is a schematic view of a thin film transistor array substrate in accordance with an embodiment of the present invention. Referring to FIG. 4, the thin film transistor array substrate 210 includes a first substrate 211, a plurality of data lines 212, a plurality of scan lines 213, a plurality of thin film transistors 300, a protective layer 214 and a plurality of pixel electrodes 215. The first substrate 211 may be made of glass or plastic materials. In this embodiment, the materials of the first substrate 211 and of the second substrate 232 are the same, such as polyimide, polyethylene terephthalate, polyethylene naphthalate or polymethacrylate. Thus, the display device 200 illustrated in FIG. 2 may be flexible display device.

The data lines 212 are disposed on the first substrate 211 and parallel to each other. The scan lines 213 are disposed on the first substrate 211 and substantially perpendicular to the data lines 212. Specifically, the scan lines 213 intersect the data lines 212 to define a plurality of pixel regions 216 on the first substrate 211. The thin film transistors 300 are respectively disposed within one of the pixel regions 216 and electrically connected to one of the scan lines 213 and one of the data lines 212 correspondingly. The structure of the thin film transistor 300 of this embodiment would be described in the following paragraphs.

Figure 5:
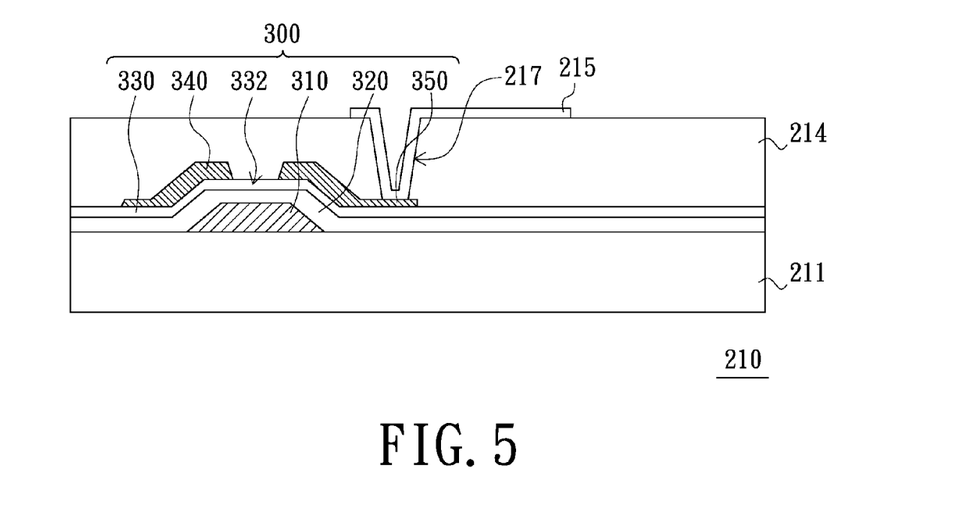
FIG. 5 is a schematic cross-section view of the thin film transistor array substrate illustrated in FIG. 4 in accordance with an embodiment of the present invention.

FIG. 5 is a schematic cross-section view of the thin film transistor array substrate illustrated in FIG. 4 in accordance with an embodiment of the present invention. Referring to FIG. 5, the thin film transistor 300 includes a gate electrode 310, a gate insulating layer 320, an oxide semiconductor layer 330, a source electrode 340 and a drain electrode 350. The gate electrode 310 and the gate insulating layer 320 are respectively disposed on the first substrate 211. Furthermore, the gate electrode 310 is covered by the gate insulating layer 320. The oxide semiconductor layer 330 is conformably disposed on the gate insulating layer 320 and has a channel region 332 located above the gate electrode 310. The source electrode 340 and the drain electrode 350 are respectively disposed on the oxide semiconductor layer 330 and located at sides of the channel region 332. Referring to FIG. 4 and FIG. 5, the source electrodes 340 are respectively electrically connected to one of the data lines 212 correspondingly. The drain electrodes 350 are respectively electrically connected to one of the pixel electrodes 215 (as shown in FIG. 4) disposed within the pixel regions 216 correspondingly.

The gate electrode 310 may be made of metal materials or transparent conductive materials. In this embodiment, the gate electrode 310 is, for example, made of molybdenum or chromium with thickness of 2000 angstrom. The gate insulating layer 320 is, for example, made of silicon oxide with thickness of 2000 angstrom. The oxide semiconductor layer 330 is, for example, made of indium gallium zinc oxide (IGZO) or indium zinc oxide (IZO) with thickness of 900 angstrom. The materials of the source electrode 340 and the drain electrode 350 may be different from or same with the materials of the gate electrode 310. In this embodiment, the source electrode 340 and the drain electrode 350 are also made of molybdenum or chromium with thickness of 2000 angstrom.

Figure 6:
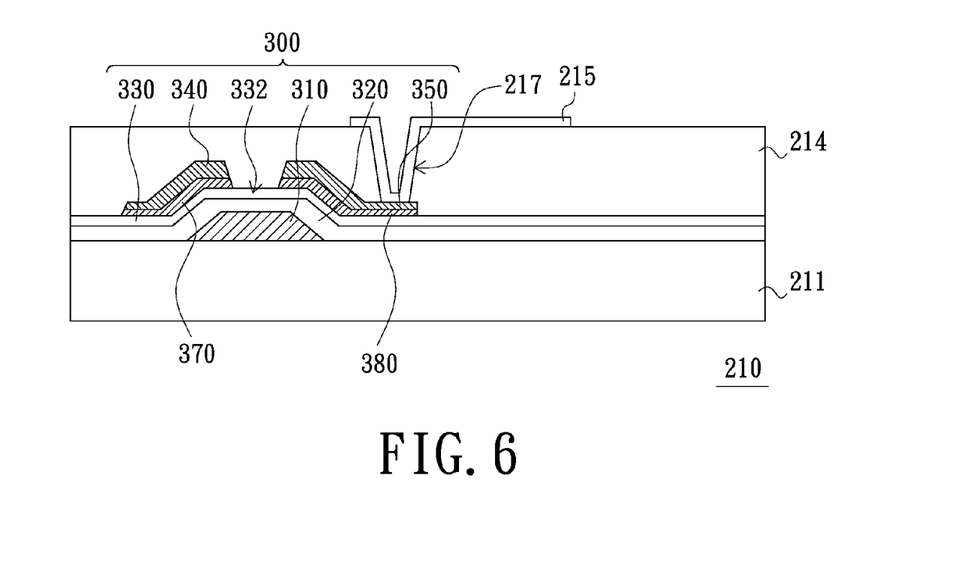
FIG. 6 is a schematic cross-section view of the thin film transistor array substrate illustrated in FIG. 4 in accordance with another embodiment of the present invention.

It should be noted that the thin film transistor 300 may further includes an ohmic contact layer 370 and an ohmic contact layer 380, as shown in FIG. 6. Referring to FIG. 6, the ohmic contact layer 370 is disposed between the source electrode 340 and the oxide semiconductor layer 330 and the ohmic contact layer 380 is disposed between the drain electrode 350 and the oxide semiconductor layer 330. Thus, the resistances between the source electrode 340/drain electrode 350 and the oxide semiconductor layer 330 may be decreased. Specially, the ohmic contact layer 370 and the ohmic contact layer 380 may be made of indium gallium zinc oxide or indium zinc oxide with higher electrical conductivity than the material of the oxide semiconductor layer 330. In detail, the oxide semiconductor layer 330, the ohmic contact layer 370 and the ohmic contact layer 380 are formed during the same sputtering process but by using different amounts of oxygen.

Figure 7:
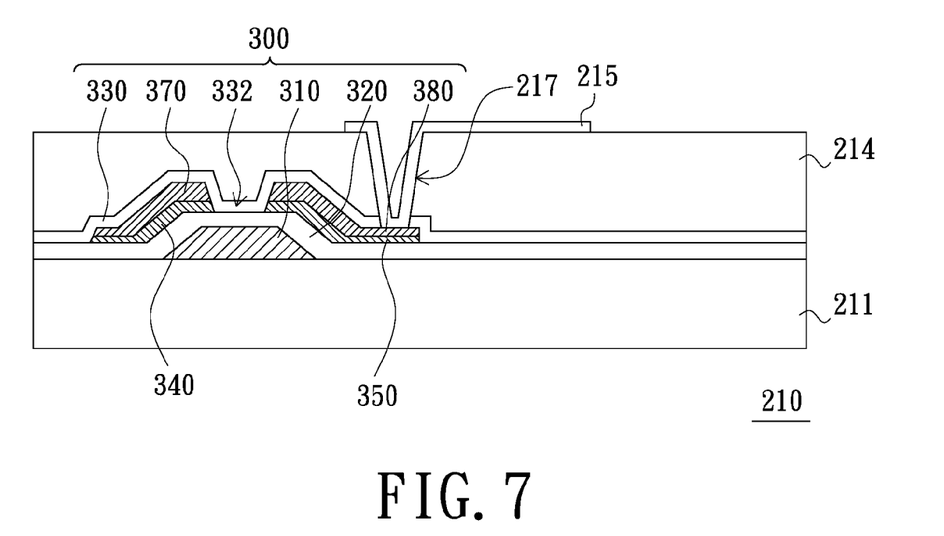
FIG. 7 is a schematic cross-section view of the thin film transistor array substrate illustrated in FIG. 4 in accordance with another embodiment of the present invention.

However, the position of the oxide semiconductor layer 330 of the present invention is not limited to between the gate insulating layer 320 and the source electrode 340/drain electrode 350. In another embodiment, the source electrode 340 and the drain electrode 350 are disposed on the gate insulating layer 320 and the oxide semiconductor layer 330 is conformably disposed on the source electrode 340 and the drain electrode 350, thus the channel region 332 is located between the source electrode 340 and the drain electrode 350, as shown in FIG. 7. Since the source electrode 340 and the drain electrode 350 are formed on the gate insulating layer 320 firstly, and then the oxide semiconductor layer 330 is formed on the source electrode 340 and the drain electrode 350 in this embodiment, the oxide semiconductor layer 330 can be protected from damaging during the patterning process of the source electrode 340 and the drain electrode 350.

Furthermore, the thin film transistor 300 of the embodiment illustrated in FIG. 7 may also include the aforementioned ohmic contact layer 370 and the ohmic contact layer 380.

In the aforementioned embodiments, since the oxide semiconductor layer 330 does not have any optical-electric properties, even the light emitted from environment illuminates the oxide semiconductor layer 330, there is not any current leakage in the thin film transistor 300. Specially, since the material of the oxide semiconductor layer 330 is transparent, it is unnecessary to remove any portion of the oxide semiconductor layer 330 during the manufacturing process of the thin film transistor array substrate 210 of the present invention and the aperture ratio of the pixel regions would not be decreased by the non-removed oxide semiconductor layer 330. Accordingly, the manufacturing process of the thin film transistor array substrate 210 of the present invention is simpler and has lower cost compared to the manufacturing process of the conventional thin film transistor array substrate 100.

Referring to FIG. 5, the protective layer 214 of the thin film transistor array substrate 210 with a plurality of contact holes 217 (for simplifying, there is only one of them is shown in FIG. 7) is disposed on the first substrate 211. The contact holes 217 is respectively corresponded to one of the pixel regions 216 to expose a portion of the drain electrode 350 of the thin film transistor 300 within the corresponding pixel region 216. It is worth to say that the material of the protective layer 214 is, for example, resin. Moreover, the protective layer 214 is formed on the first substrate 211 with thickness of about 2.5 micrometer by spin coating, so that it has good planarization.

The pixel electrodes 215 are respectively disposed within the corresponding pixel region and filled into the contact hole 217 of the protective layer 214 and thus electrically connected to the drain electrode 350. In the embodiment, the pixel electrode 215 is, for example, made of indium tin oxide (ITO), indium zinc oxide (IZO) or other conductive metal materials with thickness of 500 angstrom.

In summary, the present invention has advantages of:

1. The thin film transistor of the display device of the present invention is used oxide semiconductor material as channel layer, and since the oxide semiconductor material does not has optical-electric properties, the thin film transistor can avoid from generating the current leakage while being illuminated.

2. Since the oxide semiconductor layer can be formed at room temperature, the manufacturing process thereof can be directly completed on thermolabile plastic substrate. Accordingly, the cost of the flexible display device can be reduced and the manufacturing process of the flexible display device can be simplified by using the oxide semiconductor layer as the channel layer of the thin film transistor.

3. Since the oxide semiconductor layer is transparent, the patterning process of the oxide semiconductor layer can be omitted during the manufacturing process of the device display. Therefore, the cost and the time-consumed of the manufacturing process of the device display both can be reduced.

4. The protective layer disposed on the thin film transistor array can be made of resin for improving planarization thereof.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A thin film transistor, comprising:
a gate electrode disposed on a first substrate;
a gate insulating layer disposed on the first substrate and covering the gate electrode;
a source electrode disposed above the gate insulating layer and corresponding to one side of the gate electrode;
a drain electrode disposed above the gate insulating layer and corresponding to another side of the gate electrode; and
an oxide semiconductor layer with a channel region conformably disposed on the gate insulating layer, the channel region disposed between the source electrode and the drain electrode, wherein the source electrode has a first inner side surface, a first outer side surface, a first top surface facing the oxide semiconductor layer and a first bottom surface facing the gate insulating layer, the first inner side surface and the first outer side surface are connected between the first top surface and the first bottom surface, the drain electrode has a second inner side surface, a second outer side surface, a second top surface facing the oxide semiconductor layer and a second bottom surface facing the gate insulating layer, the second inner side surface and the second outer side surface are connected between the second top surface and the second bottom surface, the first inner side surface and the second inner side surface face the channel region, the first outer side surface and the second outer side surface are far away from the channel region, and the oxide semiconductor layer covers the first outer side surface of the source electrode and the second side surface of the drain electrode.

2. The thin film transistor as claimed in claim 1, wherein materials of the source electrode and the drain electrode comprise metal materials or transparent conductive materials.

3. The thin film transistor as claimed in claim 1, further comprising:
a first ohmic contact layer disposed between the source electrode and the oxide semiconductor layer; and
a second ohmic contact layer disposed between the drain electrode and the oxide semiconductor layer.

4. The thin film transistor as claimed in claim 1, wherein materials of the oxide semiconductor layer comprise indium zinc oxide or indium zinc oxide.

5. The thin film transistor as claimed in claim 1, wherein materials of the gate electrode comprise metal materials or transparent conductive materials.

6. A thin film transistor array substrate, comprising:
a first substrate;
a plurality of data lines disposed on the first substrate and parallel to each other;
a plurality of scan lines disposed on the first substrate and intersect the data lines to define a plurality of pixel regions on the first substrate;
a plurality of thin film transistors disposed within corresponding one of the pixel regions and electrically connected to the corresponding one of the data lines and corresponding one of the scan lines, each thin film transistor comprises:
a gate electrode disposed on the first substrate;
a gate insulating layer disposed on the first substrate and covering the gate electrode;
a source electrode disposed above the gate insulating layer and corresponding to one side of the gate electrode;
a drain electrode disposed above the gate insulating layer and corresponding to another side of the gate electrode; and
an oxide semiconductor layer with a channel region conformably disposed on the gate insulating layer and having an opening exposing a portion of the drain electrode, the channel region disposed between the source electrode and the drain electrode, wherein the source electrode has a first inner side surface, a first outer side surface, a first top surface facing the oxide semiconductor layer and a first bottom surface facing the gate insulating layer, the first inner side surface and the first outer side surface are connected between the first top surface and the first bottom surface, the drain electrode has a second inner side surface, a second outer side surface, a second top surface facing the oxide semiconductor layer and a second bottom surface facing the gate insulating layer, the second inner side surface and the second outer side surface are connected between the second top surface and the second bottom surface, the first inner side surface and the second inner side surface face the channel region, the first outer side surface and the second outer side surface are far away from the channel region, and the oxide semiconductor layer covers the first outer side surface of the source electrode and the second side surface of the drain electrode;
a protective layer covering the first substrate and having a plurality of contact holes corresponding to the openings, the contact hole and the opening corresponded with each other exposing a portion of the drain electrode of one of the thin film transistors; and
a plurality of pixel electrodes each disposed within a corresponding one of the pixel regions, each pixel electrode is correspondingly filled into one of the contact holes and the corresponding opening and electrically connected to the corresponding drain electrode.

7. The thin film transistor array substrate as claimed in claim 6, wherein materials of the source electrode and the drain electrode comprise metal materials or transparent conductive materials.

8. The thin film transistor array substrate as claimed in claim 6, wherein each thin film transistor further comprising:
a first ohmic contact layer disposed between the source electrode and the oxide semiconductor layer; and
a second ohmic contact layer disposed between the drain electrode and the oxide semiconductor layer.

9. The thin film transistor array substrate as claimed in claim 6, wherein materials of the protective layer comprise silica or resin.

10. The thin film transistor array substrate as claimed in claim 6, wherein materials of the oxide semiconductor layer comprise indium gallium zinc oxide or indium zinc oxide.

11. The thin film transistor array substrate as claimed in claim 6, wherein materials of the gate electrode comprise metal materials or transparent conductive materials.

12. The thin film transistor array substrate as claimed in claim 6, wherein materials of the first substrate comprise plastic or glass.

13. The thin film transistor array substrate as claimed in claim 12, wherein materials of the first substrate comprise polyimide, polyethylene terephthalate, polyethylene naphthalate or polymethacrylate.

14. A display device, comprising:
a thin film transistor array substrate, comprising:
a first substrate;
a plurality of data lines disposed on the first substrate and parallel to each other;
a plurality of scan lines disposed on the first substrate and substantially perpendicular to the data lines for defining a plurality of pixel regions on the first substrate;
a plurality of thin film transistors disposed within corresponding one of the pixel regions and electrically connected to the corresponding one of the data lines and corresponding one of the scan lines, each thin film transistor comprises:
a gate electrode disposed on the first substrate;
a gate insulating layer disposed on the first substrate and covering the gate electrode;
a source electrode disposed above the gate insulating layer and corresponding to one side of the gate electrode;
a drain electrode disposed above the gate insulating layer and corresponding to another side of the gate electrode; and an oxide semiconductor layer with a channel region conformably disposed on the gate insulating layer and having an opening exposing a portion of the drain electrode, the channel region disposed between the source electrode and the drain electrode, wherein the source electrode has a first inner side surface, a first outer side surface, a first top surface facing the oxide semiconductor layer and a first bottom surface facing the gate insulating layer, the first inner side surface and the first outer side surface are connected between the first top surface and the first bottom surface, the drain electrode has a second inner side surface, a second outer side surface, a second top surface facing the oxide semiconductor layer and a second bottom surface facing the gate insulating layer, the second inner side surface and the second outer side surface are connected between the second top surface and the second bottom surface, the first inner side surface and the second inner side surface face the channel region, the first outer side surface and the second outer side surface are far away from the channel region, and the oxide semiconductor layer covers the first outer side surface of the source electrode and the second side surface of the drain electrode;

a protective layer covering the first substrate and having a plurality of contact holes corresponding to the openings, the contact hole and the opening corresponded with each other exposing a portion of the drain electrode of one of the thin film transistors;

a plurality of pixel electrodes each disposed within a corresponding one of the pixel regions, each pixel electrode is correspondingly filled into one of the contact holes and the corresponding opening and electrically connected to the corresponding drain electrode;

a transparent electrode substrate, comprising:

a second substrate disposed above the thin film transistor array substrate;

a transparent electrode disposed on the second substrate and between the thin film transistor array substrate and the second substrate; and a display medium layer disposed between the thin film transistor array substrate and the transparent electrode substrate.

15. The display device as claimed in claim 14, wherein materials of the source electrode and the drain electrode comprise metal materials or transparent conductive materials.

16. The display device as claimed in claim 14, wherein each thin film transistor further comprising:

a first ohmic contact layer disposed between the source electrode and the oxide semiconductor layer; and a second ohmic contact layer disposed between the drain electrode and the oxide semiconductor layer.

17. The display device as claimed in claim 14, wherein materials of the protective layer comprise silica or resin.

18. The display device as claimed in claim 14, wherein materials of the oxide semiconductor layer comprise indium gallium zinc oxide or indium zinc oxide.

19. The display device as claimed in claim 14, wherein materials of the gate electrode comprise metal materials or transparent conductive materials.

20. The display device as claimed in claim 14, wherein the display medium layer comprises microcapsule electrophoretic layer, microcup electrophoretic layer, cholesteric liquid crystal layer, electro-wetting layer or quick response-liquid powder layer.

21. The display device as claimed in claim 14, wherein the transparent electrode substrate further comprises a color filter film disposed on the second substrate and located between the transparent electrode and the second substrate.

22. The display device as claimed in claim 14, wherein materials of the first substrate comprise plastic or glass.

23. The display device as claimed in claim 14, wherein materials of the first substrate comprise polyimide, polyethylene terephthalate, polyethylene naphthalate or polymethacrylate.

* * * * *